United States Patent
Ge

(10) Patent No.: US 8,896,343 B2
(45) Date of Patent: Nov. 25, 2014

(54) ADJUSTABLE IMPEDANCE CIRCUIT AND IMPEDANCE SETTING METHOD FOR PROVIDING DIFFERENTIAL-MODE IMPEDANCE MATCHING AND COMMON-MODE IMPEDANCE MATCHING

(71) Applicant: Realtek Semiconductor Corp., HsinChu (TW)

(72) Inventor: Lifang Ge, Suzhou (CN)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 13/975,362

(22) Filed: Aug. 25, 2013

(65) Prior Publication Data

US 2014/0070842 A1    Mar. 13, 2014

(30) Foreign Application Priority Data

Sep. 11, 2012   (CN) .......................... 2012 1 0334943

(51) Int. Cl.
*H03K 17/16*    (2006.01)
*H03K 19/003*   (2006.01)
*H03K 19/0175*  (2006.01)

(52) U.S. Cl.
CPC ............................. *H03K 19/017545* (2013.01)

USPC .................... 326/30; 326/34; 326/86; 326/87

(58) Field of Classification Search
None
See application file for complete search history.

(56) References Cited

U.S. PATENT DOCUMENTS 7,176,710 B1 * 2/2007 Luo et al. ........................ 326/30
2012/0256654 A1 * 10/2012 Cho ................................. 326/30

* cited by examiner

*Primary Examiner* — Anh Tran
(74) *Attorney, Agent, or Firm* — Winston Hsu; Scott Margo

(57) ABSTRACT

An adjustable impedance circuit includes a calibration module, an impedance module, a first switch module and a second switch module. The calibration module is arranged to generate a calibration signal. The impedance module has a plurality of impedance elements. The first switch module is coupled to the calibration module, and is arranged to receive the calibration signal and make a first portion of the impedance elements be selectively coupled between a differential input port and at least one reference voltage according to the calibration signal. The second switch module is coupled to a common-mode voltage output node, and is arranged to receive a control signal and make a second portion of the impedance elements be selectively coupled between the common-mode voltage output node and the differential input port according to the control signal.

12 Claims, 5 Drawing Sheets

US 8,896,343 B2

ADJUSTABLE IMPEDANCE CIRCUIT AND IMPEDANCE SETTING METHOD FOR PROVIDING DIFFERENTIAL-MODE IMPEDANCE MATCHING AND COMMON-MODE IMPEDANCE MATCHING

BACKGROUND OF THE INVENTION

1. Field of the Invention

The disclosed embodiments of the present invention relate to impedance adjustment, and more particularly, to an adjustable impedance circuit capable of realizing differential-mode impedance matching as well as common-mode impedance matching, and a related impedance setting method.

2. Description of the Prior Art

Most input/output (I/O) interfaces define differential-mode impedances, where resistance array self-calibration is commonly used for realizing the differential-mode impedance matching. In different fabrication processes, the resistance array self-calibration may obtain corresponding corner correction via a calibration circuit to meet the differential-mode impedance requirements for an I/O interface. Regarding an I/O interface which defines both differential-mode impedance and common-mode impedance, as the differential-mode impedance and the common-mode impedance have different definitions and impedance values, the calibration circuit is required to be designed correspondingly. For example, individual calibration circuits are needed to calibrate the differential-mode impedance and the common-mode impedance, respectively. Additional calibration circuits are needed, and power consumption and/or calibration time are increased thereof.

SUMMARY OF THE INVENTION

It is therefore one objective of the present invention to provide an adjustable impedance circuit capable of realizing differential-mode impedance matching as well as common-mode impedance matching, and a related impedance setting method thereof to solve the abovementioned problems.

According to an embodiment of the present invention, an exemplary adjustable impedance circuit is disclosed. The exemplary adjustable impedance circuit comprises a calibration module, an impedance module, a first switch module and a second switch module. The calibration module is arranged to generate a calibration signal. The impedance module has a plurality of impedance elements. The first switch module is coupled to the calibration module, and is arranged to receive the calibration signal and make a first portion of the impedance elements be selectively coupled between a differential input port and at least one reference voltage according to the calibration signal. The second switch module is coupled to a common-mode voltage output node, and is arranged to receive a control signal and make a second portion of the impedance elements be selectively coupled between the common-mode voltage output node and the differential input port according to the control signal.

According to an embodiment of the present invention, an exemplary impedance setting method is disclosed. The exemplary impedance setting method comprises the following steps: receiving a control signal; receiving a calibration signal; making a first portion of impedance elements be selectively coupled between a differential input port and at least one reference voltage according to the calibration signal; and making a second portion of the impedance elements be selectively coupled between a common-mode voltage output node and the differential input port according to the control signal.

Whether an I/O interface defines common-mode impedance matching or not, the proposed adjustable impedance circuit and the related impedance setting method can be applied to the I/O interface. Additionally, only a single calibration circuit/module is required for the proposed adjustable impedance circuit to realize the differential-mode impedance adjustment/matching as well as the common-mode impedance adjustment/matching. As a result, the circuit area of the adjustable impedance circuit dose not need to be increased, and no additional calibration time is needed. Moreover, compared to a conventional differential-mode impedance matching circuit, the proposed adjustable impedance circuit only adds a switch module (e.g. a switch module including transmission gates), and almost no additional power is consumed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
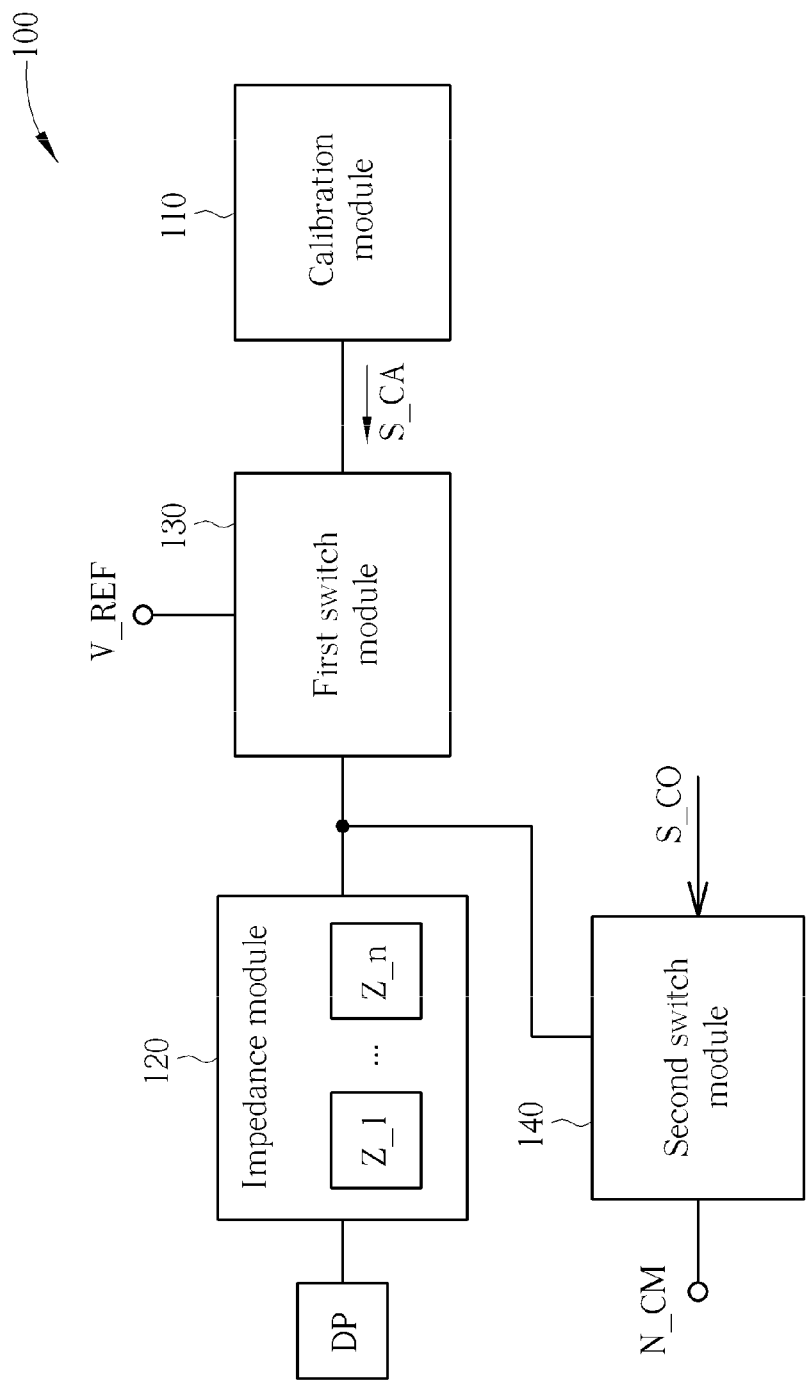
FIG. 1 is a block diagram illustrating an exemplary adjustable impedance circuit according to an embodiment of the present invention.

Please refer to FIG. 1, which is a block diagram illustrating an exemplary adjustable impedance circuit according to an embodiment of the present invention. The exemplary adjustable impedance circuit 100 includes, but is not limited to, a calibration module 110, an impedance module 120, a first switch module 130 and a second switch module 140. The calibration module 110 is arranged to generate a calibration signal S_CA. The impedance module 120 has a plurality of resistive elements $Z\_1$-$Z\_n$. The first switch module 130 is coupled to the calibration module 110, and is arranged to receive the calibration signal S_CA, and make a first portion of the resistive elements $Z\_1$-$Z\_n$ be selectively coupled between a differential input port DP and at least one reference voltage V_REF (e.g. a voltage source (high reference voltage), a ground voltage (low reference voltage) and/or a constant voltage) according to the calibration signal S_CA. The second switch module 140 is coupled to a common-mode voltage output node N_CM, and is arranged to receive control signal S_CO, and make a second portion of the resistive elements $Z\_1$-$Z\_n$ be selectively coupled between the common-mode voltage output node N_CM and the differential input port DP, wherein the control signal S_CO may be provided by the calibration module 110 or controlled by a circuit system.

In an implementation of the adjustable impedance circuit 100 adjusting the differential-mode impedance only, when the impedance module 120 is coupled to the reference voltage V_REF but not coupled to the common-mode voltage output node N_CM, the adjustable impedance circuit 100 may provide a differential-mode impedance according to all of the impedance elements Z_1-Z_n coupled between the reference voltage V_REF and the differential input port DP.

In an implementation of the adjustable impedance circuit 100 adjusting the common-mode impedance as well as the differential-mode impedance, when the impedance module 120 is coupled to the reference voltage V_REF and the common-mode voltage output node N_CM, the adjustable impedance circuit 100 may provide a differential-mode impedance according to the first portion of the impedance elements Z_1-Z_n, coupled between the differential input port DP and the reference voltage V_REF, and the second portion of the impedance elements Z_1-Z_n, coupled between the common-mode voltage output node N_CM and the differential input port DP. In addition, the adjustable impedance circuit 100 may provide a common-mode impedance according to the first portion of the impedance elements Z_1-Z_n, coupled between the differential input port DP and the reference voltage V_REF. In a preferred implementation, when the second switch module 140 makes the second portion of the impedance elements Z_1-Z_n be coupled to the common-mode voltage output node N_CM according to the control signal S_CO, the second portion of the impedance elements Z_1-Z_n (coupled to the common-mode voltage output node N_CM) are not coupled between the reference voltage V_REF and the differential input port DP.

Based on the above description, the concept of the present invention is to add a switch module (e.g. the second switch module 140) and appropriately design the coupling operation between the impedance elements (e.g. the impedance elements Z_1-Z_n) and the switch modules (e.g. the first switch module 130 and the second switch module 140) to thereby achieve the objective of employing a same impedance circuit to realize the differential-mode impedance matching and the common-mode impedance matching. Further description is provided in the following.

The adjustable impedance circuit 100 shown in FIG. 1 is a basic architecture based on the concept of the present invention. Any circuit employing the architecture shown in FIG. 1 falls within the scope of the present invention. To facilitate an understanding of the present invention, an exemplary implementation is given in the following for further description of the proposed adjustable impedance circuit. It should be noted that other circuit implementations employing the architecture shown in FIG. 1 are feasible. Please refer to FIG. 2, which is a diagram illustrating an implementation of the adjustable impedance circuit 100 shown in FIG. 1. In this implementation, the differential port DP includes a first input node INP and a second input node INN, and the reference voltage V_REF includes a voltage source V_S and a ground voltage GND. The impedance module 120 includes a first impedance unit 222 and a second impedance unit 224, wherein the first impedance unit 222 and the second impedance unit 224 have a plurality of first impedance elements R1[1]-R1[N] and a plurality of second impedance elements R2[1]-R2[N], respectively. In addition, the first switch module 130 includes a first switch unit 232 and a second switch unit 234, wherein the first switch unit 232 is coupled between the first impedance unit 222 and the calibration module 110, and the second switch unit 234 is coupled between the second impedance unit 224 and the calibration module 110.

In this implementation, the first switch unit 232 includes a plurality of p-channel metal-oxide-semiconductor field effect transistors (PMOSFET) PM1[1]-PM1[N] and a plurality of n-channel metal-oxide-semiconductor field effect transistors (NMOSFET) NM1[1]-NM1[N], wherein the PMOSFETs PM1[1]-PM1[N] may make the corresponding first impedance elements R1[1]-R1[N] be selectively coupled between the voltage source V_S and the first input node INP according to the calibration signal S_CA, and the NMOSFETs NM1[1]-NM1[N] may make the corresponding first impedance elements R1[1]-R1[N] be selectively coupled between the ground voltage GND and the first input node INP according to the calibration signal S_CA. Similarly, the second switch unit 234 includes a plurality of PMOSFETs PM2[1]-PM2[N] and a plurality of NMOSFETs NM2[1]-NM2[N], wherein the PMOSFETs PM2[1]-PM2[N] may make the corresponding second impedance elements R2[1]-R2[N] be selectively coupled between the voltage source V_S and the second input node INN according to the calibration signal S_CA, and the NMOSFETs NM2[1]-NM2[N] may make the corresponding second impedance elements R2[1]-R2[N] be selectively coupled between the ground voltage GND and the second input node INN according to the calibration signal S_CA.

The second switch module 140 includes a third switch unit 242 and a fourth switch unit 244, wherein both the third switch unit 242 and the fourth switch unit 244 are coupled to the common-mode voltage node N_CM. In this implementation, the third switch unit 242 may include a plurality of transmission gates CM1[1]-CM1[Ncm], wherein the transmission gates CM1[1]-CM1[Ncm] are arranged to make at least one portion of the first impedance elements R1[1]-R1[N] (e.g. impedance elements R1[1]-R1[Ncm]) be selectively coupled between the common-mode voltage node N_CM and the first input node INP according to the control signal S_CO. Similarly, the fourth switch unit 242 may include a plurality of transmission gates CM2[1]-CM2[Ncm], wherein the transmission gates CM2[1]-CM2[Ncm] are arranged to make at least one portion of the second impedance elements R2[1]-R2[N] (e.g. impedance elements R2[1]-R2[Ncm]) be selectively coupled between the common-mode voltage node N_CM and the second input node INN according to the control signal S_CO.

Figure 2:
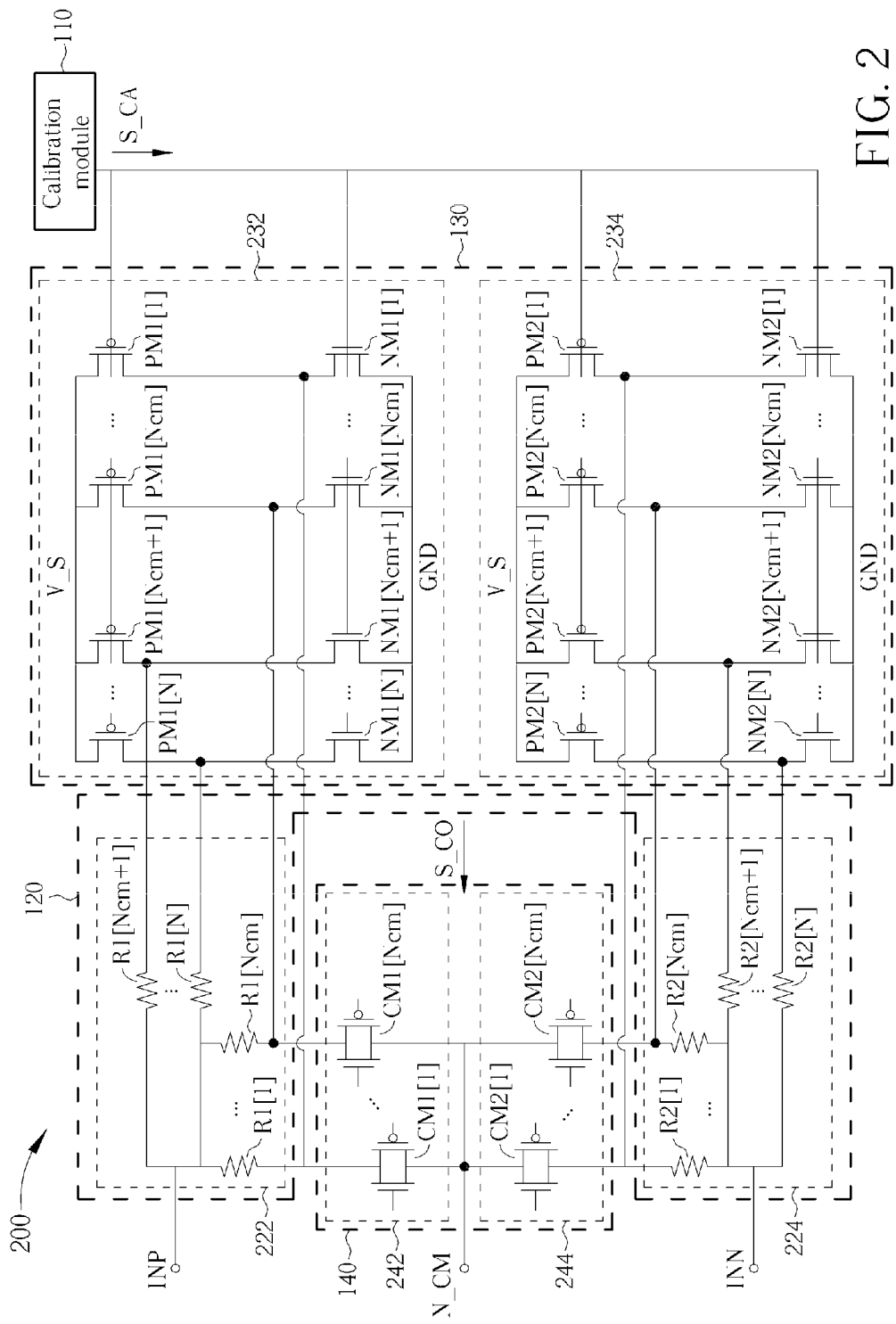
FIG. 2 is a diagram illustrating an implementation of the adjustable impedance circuit shown in FIG. 1.
Figure 3:
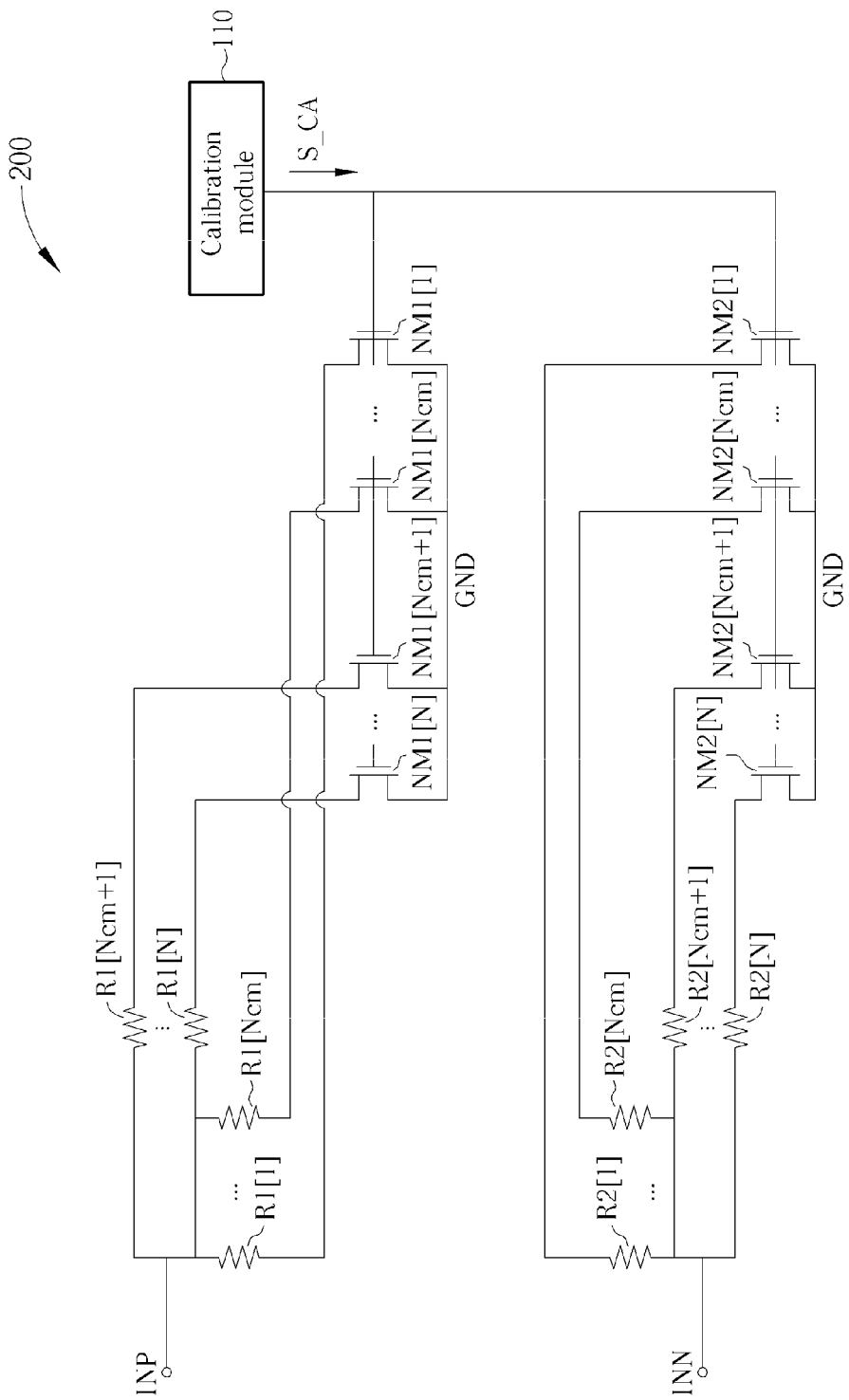
FIG. 3 is a diagram illustrating an implementation of the adjustable impedance circuit shown in FIG. 2 which adjusts the differential-mode impedance to ground.

The description of the adjustable impedance circuit 200 adjusting the differential-mode impedance only is detailed as follows. Please refer to FIG. 2 and FIG. 3 together. FIG. 3 is a diagram illustrating an implementation of the adjustable impedance circuit 200 shown in FIG. 2 adjusting the differential-mode impedance to ground (i.e. the reference voltage V_REF or the ground voltage GND). As shown in FIG. 2 and FIG. 3, in a case where the adjustable impedance circuit 200 is used to adjust the differential-mode impedance only (e.g. the first input node INP and the second input node INN respectively receive a positive voltage signal and a negative voltage signal composed of a differential input), the second switch module 140 is turned off according to the control signal S_CO. In addition, the NMOSFETs NM1[1]-NM1[N] may make the first impedance elements R1[1]-R1[N] be selectively coupled between the first input node INP and the ground voltage GND according to the calibration signal S_CA generated from the calibration module 110, respectively; and the NMOSFETs NM2[1]-NM2[N] may make the second impedance elements R2[1]-R2[N] be selectively coupled between the second input node INN and the ground voltage GND according to the calibration signal S_CA, respectively. For example, the NMOSFETs NM1[1]-NM1[M] are turned on according to the calibration signal S_CA for making the first impedance elements R1[1]-R1[M] be coupled between the first input node INP and the ground voltage GND. Similarly, the NMOSFETs NM2[1]-NM2[M] are turned on according to the calibration signal S_CA for making the second impedance elements R2[1]-R2[M] be coupled between the second input node INN and the ground voltage GND. If it is assumed that an impedance value of each impedance element in the impedance module 120 is R0, then the differential impedance value 2×R0/M may be obtained, where 0<M≤N. As the impedance value R0 changes with fabrication processes, the calibration module 110 may select a suitable value M according to the impedance value R0, thereby achieving the objective of the impedance adjustment/matching.

It should be noted that the above circuit may employ other resistance array self-calibration techniques. In other words, the above is for illustrative purposes only, and is not meant to be a limitation of the present invention. In an alternative design, the impedance elements in the impedance module 120 may not have the same impedance value. In another alternative design, the adjustable impedance circuit 200 may be used to adjust the differential-mode impedance to the voltage source/the constant voltage only. The adjustable impedance circuit 200 may be used to adjust the differential-mode impedance to the voltage source, the ground voltage, and/or the constant voltage according to the calibration signal S_CA. In view of the above, the reference voltage V_REF shown in FIG. 1 may be at least one of a voltage source (e.g. the voltage source V_S shown in FIG. 2), a ground voltage (e.g. the ground voltage GND shown in FIG. 2) and a constant voltage.

Figure 4:
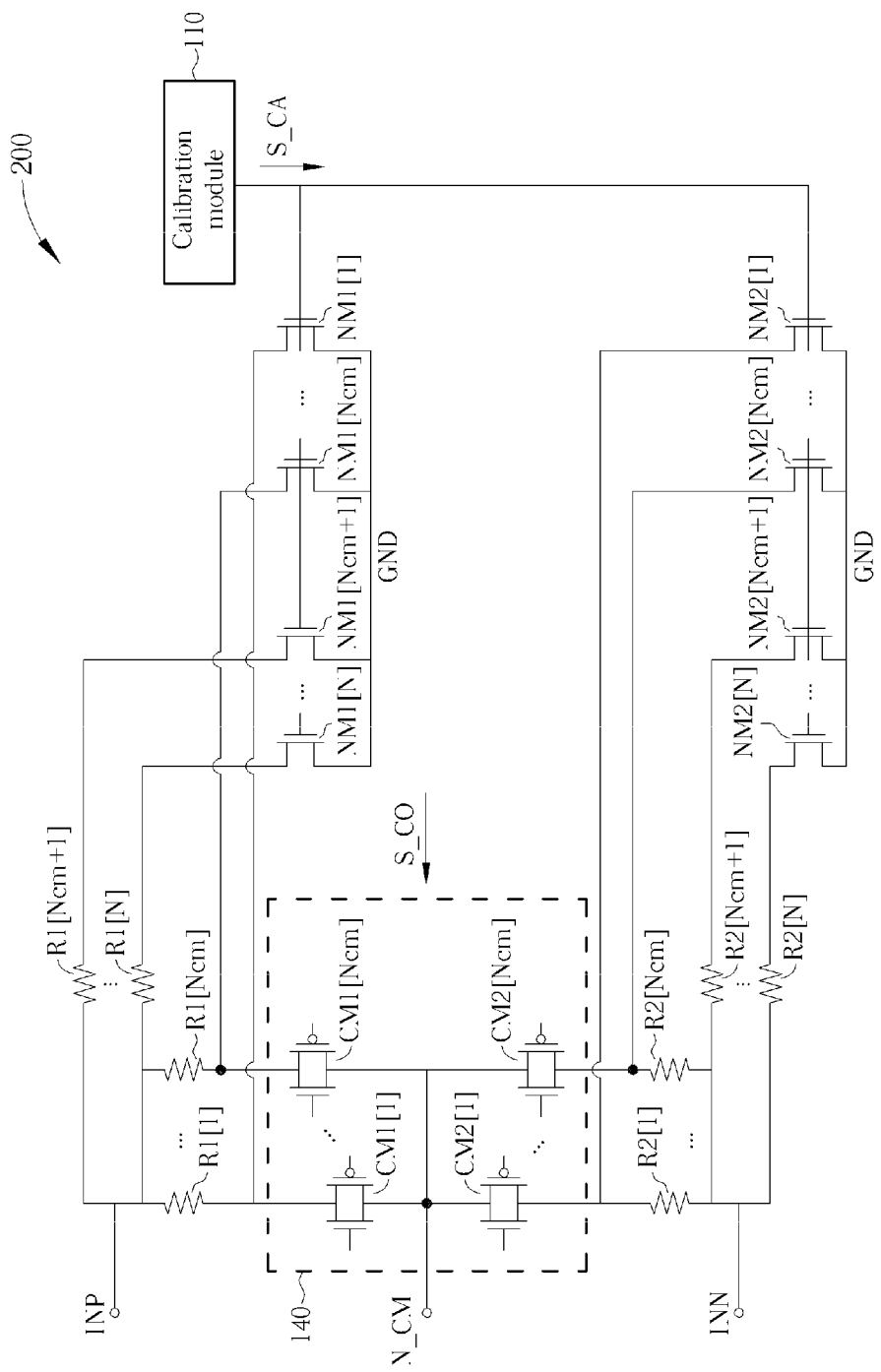
FIG. 4 is a diagram illustrating an implementation of the adjustable impedance circuit which adjusts the common-mode impedance as well as the differential-mode impedance to ground.

The adjustable impedance circuit 200 may be used to adjust the common-mode impedance as well as the differential-mode impedance. Please refer to FIG. 2 and FIG. 4 together. FIG. 4 is a diagram illustrating an implementation of the adjustable impedance circuit 200 adjusting the common-mode impedance as well as the differential-mode impedance to ground (i.e. the reference voltage V_REF or the ground voltage GND). As shown in FIG. 2 and FIG. 4, in a case where the adjustable impedance circuit 200 is used to adjust the differential-mode impedance (e.g. the first input node INP and the second input node INN respectively receive a positive voltage signal and a negative voltage signal composed of a differential input), the second switch module 140 may be turned on according to the control signal S_CO; the transmission gates CM1[1]-CM1[Ncm] may make the first impedance elements R1[1]-R1[Ncm] be selectively coupled between the common-mode voltage output node N_CM and the first input node INP according to the control signal S_CO, respectively; the transmission gates CM2[1]-CM2[Ncm] may make the second impedance elements R2[1]-R2[Ncm] be selectively coupled between the common-mode voltage output node N_CM and the second input node INN according to the control signal S_CO, respectively; the NMOSFETs NM1[1]-NM1[N] may make the first impedance elements R1[1]-R1[N] be selectively coupled between the first input node INP and the ground voltage GND according to the calibration signal S_CA, respectively; and the NMOSFETs NM2[1]-NM2[N] may make the second impedance elements R2[1]-R2[N] be selectively coupled between the second input node INN and the ground voltage GND according to the calibration signal S_CA, respectively.

For example, the transmission gates CM1[1]-CM1[Ncm] are turned on according to the control signal S_CO for making the first impedance elements R1[1]-R1[Ncm] be coupled between the common-mode voltage output node N_CM and the first input node INP. In addition, the NMOSFETs NM1[Ncm+1]-NM1[M] are turned on (i.e. the remaining N−(M−Ncm) NMOSFETs are turned off) according to the calibration signal S_CA for making the first impedance elements R1[Ncm+1]-R1[M] be coupled between the first input node INP and the ground voltage GND. In other words, there are M impedance elements turned on (i.e. the first impedance elements R1[1]-R1[Ncm] and the first impedance elements R1[Ncm+1]-R1[M] are turned on, or a second portion Ncm of the impedance elements and a first portion (M−Ncm) of the impedance elements are turned on), where M≤N.

Moreover, the transmission gates CM2[1]-CM2[Ncm] are turned on according to the control signal S_CO for making the second impedance elements R2[1]-R2[Ncm] be coupled between the common-mode voltage output node N_CM and the second input node INN. In addition, the NMOSFETs NM2[Ncm+1]-NM2[M] are turned on according to the calibration signal S_CA (i.e. the remaining N−(M−Ncm) NMOSFETs are turned off) for making the second impedance elements R2[Ncm+1]-R2[M] be coupled between the second input node INN and the ground voltage GND. In other words, there are M impedance elements turned on (i.e. the second impedance elements R2[1]-R2[Ncm] and the second impedance elements R2[Ncm+1]-R2[M] are turned on, or a second portion Ncm of the impedance elements and a first portion (M−Ncm) of the impedance elements are turned on), where M≤N.

In one embodiment, if it is assumed that an impedance value of each impedance element in the impedance module 120 is R0, then the common-mode voltage output node N_CM may have a voltage substantially equal to zero in the small signal model, called virtual ground. Therefore, the differential impedance value identical to that in the implementation shown in FIG. 3 (i.e. 2×R0/M, where 0<M≤N) may still be obtained. Additionally, in a case where the adjustable impedance circuit 200 is used to adjust the common-mode impedance (e.g. the first input node INP and the second input node INN receives voltage signals having the same polarity), the provided common-mode impedance value is 0.5×R0/(M−Ncm). Hence, as long as the suitable values of R0, M, Ncm and N are selected, the adjustable impedance circuit 200 may provide the required differential-mode impedance value and common-mode impedance value to thereby achieve the objective of the impedance adjustment/matching.

Please note that the above is for illustrative purposes only, and is not meant to be a limitation of the present invention. In an alternative design, the adjustable impedance circuit 200 may be used to adjust the differential-mode impedance to the voltage source (i.e. the reference voltage V_REF or the voltage source V_S), wherein the adjustment is carried out by turning on/off the PMOSFET(s) in the first switch module 130. As the operation principle is similar to that of the above embodiments, further description is omitted for brevity. In another alternative design, the impedance elements may not have the same impedance value. In still another alternative design, not all of the transmission gates CM1[1]-CM1[Ncm]/CM2[1]-CM2[Ncm] are turned on. In yet another alternative design, the second switch module 140 may include switching device(s) rather than transmission gate(s).

In this implementation, when the second switch module 140 makes a portion of impedance elements (e.g. the impedance elements R1[1]-R1[Ncm] or R2[1]-R2[Ncm]) be coupled to the common-mode voltage output node N_CM, the portion of the impedance elements (e.g. the impedance elements R1[1]-R1[Ncm] or R2[1]-R2[Ncm]) may not be coupled between the ground voltage GND and the differential input port DP (i.e. the first input node INP and the second input node INN). However, this is for illustrative purposes only, and is not meant to be a limitation of the present invention. For example, when the adjustable impedance circuit 200 is used to adjust the common-mode impedance as well as the differential-mode impedance (i.e. the operation shown in FIG. 4), if the adjustable impedance circuit 200 is required to provide the differential-mode impedance only, a transmission gate and a MOSFET (each corresponds to the same turn-on impedance element) are allowed to be turned on simultaneously.

A mobile high-definition link (MHL) interface is taken as an example to describe the principle of the values M and Ncm selection. Please note that this is for illustrative purposes only, and is not meant to be a limitation of the present invention. In a case where the required common-mode impedance ZC in the MHL interface is from 25 ohms to 35 ohms, and the required differential-mode impedance ZD in the MHL interface is from 90 ohms to 110 ohms, as the description directed to FIG. 4 mentions that the differential-mode impedance value can be 2×R0/M, the relation 45≤R0/M≤55 can be obtained. In other words:

$$R0/M\min=55 \quad (1)$$

$$R0/M\max=45 \quad (2)$$

where the values Mmax and Mmin are the maximum and minimum of the value M, respectively. Based on the implementation shown in FIG. 4, the provided common-mode impedance can be 0.5×R0/(M−Ncm). That is:

$$ZC(\max)=0.5\times R0/(M\min-Ncm) \quad (3)$$

$$ZC(\min)=0.5\times R0/(M\max-Ncm) \quad (4)$$

where the values ZC(max) and ZC(min) are the maximum and minimum of the value ZC, respectively. Next, by substituting the expressions (1) and (2) into the expressions (3) and (4), respectively, it can be obtained that:

$$ZC(\max)=27.5/(1-Ncm/M\min) \quad (5)$$

$$ZC(\min)=27.5/(1--Ncm/M\max) \quad (6)$$

As the common-mode impedance ZC ranges between 25 ohms and 35 ohms, ZC(max)≤35 and ZC(min)≤25. Additionally, from the expressions (5) and (6), it can be obtained that:

$$0.1\times M\max\leq Ncm\leq 0.214\times M\min \quad (7)$$

As long as the expression (7) is satisfied, the proposed adjustable impedance circuit requires only a single calibration module to realize the differential-mode impedance adjustment/matching as well as common-mode impedance adjustment/matching. In one implementation, when the circuit accuracy of the calibration module 110 in the adjustable impedance circuit 200 is enhanced to meet the condition 95≤ZD≤105, the relation 0.05×Mmax≤Ncm≤0.25×Mmin can be obtained based on the above calculation procedure. The selection range of the value Ncm depends on the circuit accuracy of the calibration module 110.

Figure 5:
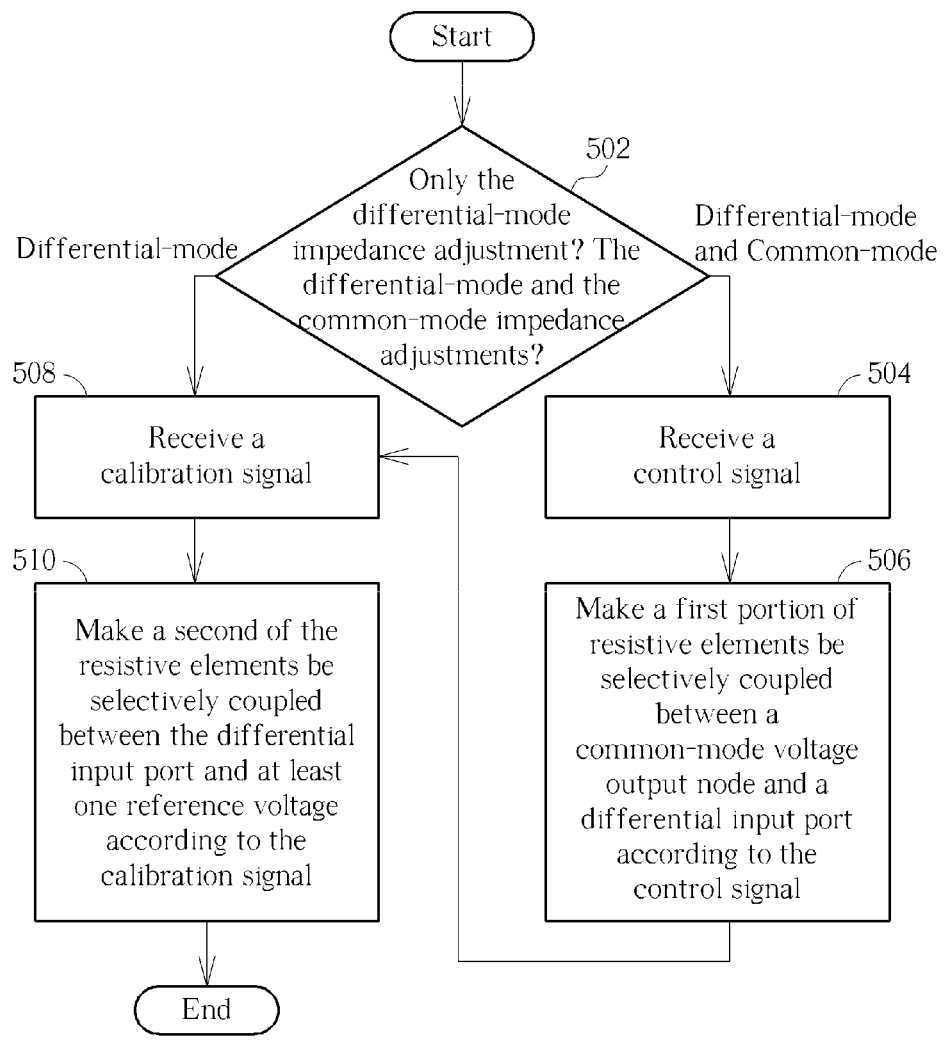
FIG. 5 is a flowchart illustrating an exemplary impedance setting method according to an embodiment of the present invention.

In brief, compared to the conventional resistance array self-calibration technique, the proposed adjustable impedance circuit may realize the differential-mode impedance adjustment/matching as well as common-mode impedance adjustment/matching by simply adding a switch module. The impedance setting method employed in the above adjustable impedance circuit may be summarized as the flowchart shown in FIG. 5, which illustrates an exemplary impedance setting method according to an embodiment of the present invention. Provided that the result is substantially the same, steps are not required to be executed in the exact order shown in FIG. 5. Further description is detailed as follows.

Step 502: Determine if only the differential-mode impedance adjustment is to be performed or the differential-mode and the common-mode impedance adjustments are to be performed simultaneously. If both the differential-mode impedance matching and the common-mode impedance matching are to be performed, go to step 504; otherwise, go to step 508.

Step 504: Receive a control signal.

Step 506: Make a first portion of resistive elements be selectively coupled between a common-mode voltage output node and a differential input port according to the control signal.

Step 508: Receive a calibration signal.

Step 510: Make a second of the resistive elements be selectively coupled between the differential input port and at least one reference voltage according to the calibration signal.

In step 502, the determination may be made by referring to an I/O interface type of a signal reception end. For example, when the I/O interface of the signal reception end only defines the differential-mode impedance, steps 504 and 506 will not be executed; and when the I/O interface of the signal reception end defines the common-mode impedance, or both the differential-mode impedance and the common-mode impedance, both steps 504 and 506 will be executed. As a person skilled in the art can readily understand the operation of each step shown in FIG. 5 after reading the above description directed to FIGS. 1-4, further description is omitted for brevity.

In summary, whether an I/O interface defines common-mode impedance matching or not, the proposed adjustable impedance circuit and the related impedance setting method can be applied to the I/O interface. Additionally, only a single calibration circuit/module is required for the proposed adjustable impedance circuit to realize the differential-mode impedance adjustment/matching as well as the common-mode impedance adjustment/matching. As a result, the circuit area of the adjustable impedance circuit will not be increased, and no additional calibration time is needed. Moreover, compared to the conventional differential-mode impedance matching circuit, the proposed adjustable impedance circuit only adds a switch module (e.g. a switch module including transmission gates), and almost no additional power is consumed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An adjustable impedance circuit, comprising:
   a calibration module, for generating a calibration signal;
   an impedance module, having a plurality of impedance elements;
   a first switch module, coupled to the calibration module, for receiving the calibration signal, and making a first portion of the impedance elements be selectively coupled between a differential input port and at least one reference voltage according to the calibration signal; and
   a second switch module, coupled to a common-mode voltage output node, for receiving a control signal, and making a second portion of the impedance elements be selectively coupled between the common-mode voltage output node and the differential input port according to the control signal.

2. The adjustable impedance circuit of claim 1, wherein when the impedance module is coupled to the at least one reference voltage but not coupled to the common-mode voltage output node, the adjustable impedance circuit provides a differential-mode impedance according to the first portion of the impedance elements coupled between the differential input port and the at least one reference voltage.

3. The adjustable impedance circuit of claim 1, wherein when the impedance module is coupled to the at least one reference voltage as well as the common-mode voltage output node, the adjustable impedance circuit provides a differential-mode impedance according to the first portion of the impedance elements, coupled between the differential input port and the at least one reference voltage, and the second portion of the impedance elements, coupled between the common-mode voltage output node and the differential input port.

4. The adjustable impedance circuit of claim 1, wherein when the impedance module is coupled to the at least one reference voltage as well as the common-mode voltage output node, the adjustable impedance circuit provides a common-mode impedance according to the first portion of the impedance elements coupled between the differential input port and the at least one reference voltage.

5. The adjustable impedance circuit of claim 1, wherein the at least one reference voltage is at least one of a voltage source, a ground voltage and a constant voltage.

6. The adjustable impedance circuit of claim 1, wherein the differential input port comprises a first input node and a second input node; the impedance module comprises:
   a first impedance unit, having a plurality of first impedance elements; and
   a second impedance unit, having a plurality of second impedance elements;
the first switch module comprises:
   a first switch unit, coupled between the first impedance unit and the calibration module, having a plurality of first switch elements, wherein the first switch elements make the first impedance elements be selectively coupled between the at least one reference voltage and the first input node according to the calibration signal, respectively; and
   a second switch unit, coupled between the second impedance unit and the calibration module, having a plurality of second switch elements, wherein the second switch elements make the second impedance elements be selectively coupled between the at least one reference voltage and the second input node according to the calibration signal, respectively; and
the second switch module comprises:
   a third switch unit, coupled to the common-mode voltage output node, for making at least one portion of the first impedance elements be selectively coupled between the common-mode voltage output node and the first input node according to the control signal; and
   a forth switch unit, coupled to the common-mode voltage output node, for making at least one portion of the second impedance elements be selectively coupled between the common-mode voltage output node and the second input node according to the control signal.

7. An impedance setting method, comprising:
receiving a control signal;
receiving a calibration signal;
making a first portion of impedance elements be selectively coupled between a differential input port and at least one reference voltage according to the calibration signal; and
making a second portion of the impedance elements be selectively coupled between a common-mode voltage output node and the differential input port according to the control signal.

8. The impedance setting method of claim 7, further comprising:
when the second portion of the impedance elements are not coupled to the common-mode voltage output node, providing a differential-mode impedance according to the first portion of the impedance elements coupled between the differential input port and the at least one reference voltage.

9. The impedance setting method of claim 7, further comprising:
when the impedance elements are coupled to the at least one reference voltage as well as the common-mode voltage output node, providing a differential-mode impedance according to the first portion of the impedance elements, coupled between the differential input port and the at least one reference voltage, and the second portion of the impedance elements, coupled between the common-mode voltage output node and the differential input port.

10. The impedance setting method of claim 7, further comprising:
when the impedance elements are coupled to the at least one reference voltage as well as the common-mode voltage output node, providing a common-mode impedance according to the first portion of the impedance elements coupled between the differential input port and the at least one reference voltage.

11. The impedance setting method of claim 7, wherein the second portion of the impedance elements, coupled to the common-mode voltage output node, are not coupled between the differential input port and the at least one reference voltage.

12. The impedance setting method of claim 7, wherein the at least one reference voltage is at least one of a voltage source, a ground voltage and a constant voltage.

* * * * *